(12) United States Patent
Park

(10) Patent No.: US 7,164,173 B2
(45) Date of Patent: Jan. 16, 2007

(54) METHOD FOR MANUFACTURING MOS TRANSISTOR AND SEMICONDUCTOR DEVICE EMPLOYING MOS TRANSISTOR MADE USING THE SAME

(75) Inventor: Geon-Ook Park, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 99 days.

(21) Appl. No.: 10/994,640

(22) Filed: Nov. 23, 2004

(65) Prior Publication Data

US 2005/0093068 A1 May 5, 2005

Related U.S. Application Data

(62) Division of application No. 10/626,549, filed on Jul. 25, 2003, now Pat. No. 6,902,968.

(30) Foreign Application Priority Data

Jul. 25, 2002 (KR) .......................... 2002-0043853

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ...................... 257/368; 257/374; 257/382

(58) Field of Classification Search ........ 257/337–338, 257/368–369, 374, 382–383, 388
See application file for complete search history.

(56) References Cited

U.S. PATENT DOCUMENTS

| 6,265,271 | B1 | 7/2001 | Thei et al. |
| 6,274,420 | B1 | 8/2001 | Xiang et al. |
| 6,350,661 | B1 | 2/2002 | Lim et al. |
| 6,432,816 | B1 | 8/2002 | Kim et al. |
| 6,479,361 | B1 | 11/2002 | Park |

*Primary Examiner*—Hoai Pham
(74) *Attorney, Agent, or Firm*—Pillsbury Winthrop Shaw Pittman LLP

(57) ABSTRACT

A method for manufacturing a metal-oxide-semiconductor transistor prevents the occurrence of a contact spiking phenomenon. The method includes forming a metal thin film and an isolation oxidation film on a semiconductor substrate, and selectively etching the isolation oxidation film such that the isolation oxidation film is left remaining only over a field oxidation film; heat treating the semiconductor substrate to form silicide by the metal thin film in gate, source, and drain regions; removing portions of the metal thin film that is not formed into silicide, that is, removing unreacted metal thin film; removing the isolation oxidation film left remaining on the field oxidation film; and heat treating the semiconductor substrate in an oxygen environment to form the unreacted metal thin film remaining on the field oxidation film into a metal oxidation film. The present invention is related also to a semiconductor device that employs a metal-oxide-semiconductor transistor made using the method.

6 Claims, 4 Drawing Sheets

METHOD FOR MANUFACTURING MOS TRANSISTOR AND SEMICONDUCTOR DEVICE EMPLOYING MOS TRANSISTOR MADE USING THE SAME

RELATED APPLICATIONS

This Application is a Divisional of application Ser. No. 10/626,549, filed Jul. 25, 2003 now U.S. Pat. No. 6,902,968 and claims priority from Korean Application No. 2002-0043853, filed Jul. 25, 2002, the entire contents of which applications are hereby incorporated by reference.

BACKGROUND OF THE INVENTION (a) Field of the Invention

The present invention relates to a method for manufacturing a MOS (metal-oxide-semiconductor) transistor of a semiconductor device. More particularly, the present invention relates to a method for manufacturing a MOS transistor that prevents contact spiking (i.e., excessive etching) of a field oxidation film adjacent to a device region during etching to form contact holes. The present invention relates also to a semiconductor device employing a MOS transistor manufactured using the method of the present invention.

(b) Description of the Related Art

There are two general classes of field effect transistors (FETs) and they include the MOSFET and the JFET (junction FET). The present invention is related to the MOSFET. The MOSFET typically includes on a semiconductor substrate the electrodes of a source, a drain, and a gate. Metal interconnect lines are connected to upper areas of the source, drain, and gate to allow application (of electrical signals to the same, and the electrodes and the metal interconnect lines are electrically connected through contact formed at contact hole.

In order to minimize the resistance of each of the electrodes, silicide films are formed between the metal interconnect lines and each electrode of the source, drain, and gate. A silicon nitride film, which functions as an etching completion layer during etching to form contact holes, is deposited over an entire upper surface of the transistor that includes the silicide films.

FIGS. 1A to 1B are partial sectional views used to describe a conventional method for manufacturing a MOS transistor.

With reference to FIG. 1A, thermal oxidation of a silicon wafer 1, on which a device region is defined, is performed by a field oxidation film 2 using a LOCOS (local oxidation of silicon) or trench process such that a gate oxidation film 3 is grown on a surface of the device region of the silicon wafer 1. After depositing polysilicon, which will be used for gate electrodes 4, over an entire upper surface of the silicon wafer 1, the polysilicon and the gate oxidation layer 3 are patterned to a predetermined width.

Next, a p-type or n-type dopant is ion-injected at a low concentration on the device region of the silicon wafer 1 using a mask. As a result, LDDs (lightly doped drains) 5 are formed on the device region of the silicon wafer 1, as are side walls 6 to both sides of the gate oxidation film 3 and the gate electrode 4. Following this operation, a conducting dopant identical to that used for the LDDs 5 is ion-injected at a high concentration on the device region of the silicon wafer 1 using a mask to thereby form a source 7 and a drain 7.

Subsequently, titanium is deposited to a thickness of approximately 400Å over the entire surface of the silicon wafer 1 by a sputtering method, then RTP (rapid thermal processing) is performed for about 30 seconds and at a temperature of roughly 750 Å while injecting nitrogen at a flow rate of approximately 50 sccm . As a result, with reference to FIG. 1A, titanium suicide 8' is formed by the reaction between titanium and silicon. The titanium on the side walls 6 and the field oxidation film 2 is not reacted and therefore remains as unreacted titanium.

The unreacted titanium is a metal and so may interfere with device operation. The unreacted titanium is therefore removed using a solvent. Also, in order to reduce the resistance of the suicide 8' and increase the strength of the same, a heat process is performed in a nitrogen environment and at a temperature of approximately 910 Å.

After the above processes, in order to form a liner film that is used as an etching completion layer during etching to form contact holes, a silicon nitride film 9, with reference to FIG. 1A, is formed to a thickness of roughly 300 Å using plasma enhanced chemical vapor deposition (PECVD).

In the above process, the silicon nitride film 9 is less thickly deposited at depressed areas adjacent to the device region (one of which is circled using a dotted line in FIG. 1A) than in other areas. The depressed areas are formed as a result of structural problems occurring when forming the field oxidation film 2.

Next, an insulating layer, that is, a pre-metal dielectric (PMD) layer 10 is thickly formed by using atmospheric pressure chemical vapor deposition (APCVD) on the silicon nitride film 9, after which the PMD layer 10 is heat treated to improve the strength of the same. Chemical mechanical polishing (CMP) is then performed to flatten the PMD layer 10.

Subsequently, to prepare for the formation of contact holes, a photosensitive film pattern 11 is formed on the flattened PMD layer 10. With reference to FIG. 1B, exposed areas of the PMD layer 10 are then etched using the photosensitive film pattern 11 as a mask to thereby form contact holes 12.

Next, TiN 13 is then thinly deposited as a barrier metal film over the entire upper surface of the silicon wafer 1, after which tungsten 14 is used to fill the contact holes 12.

In the above conventional method for manufacturing a MOS transistor, the silicon nitride film 9, which is used as an etching completion layer, is not formed to a uniform thickness. As a result, when etching the PMD layer 10, the areas of the silicon nitride film 9 formed over the depressed areas of the field oxidation film 2 adjacent to the device region are more quickly etched than other areas of the silicon nitride film 9. Therefore, a contact spiking phenomenon occurs, in which the silicon nitride film 9 is over-etched past where the field oxidation film 2 (under these areas of the silicon nitride film 9) starts. One such area is circled using a dotted line in FIG. 1B. The contact spiking phenomenon ultimately results in the interference of the flow of current in the source 7 and the drain 7 such that the semiconductor device operates improperly.

Such a contact spiking phenomenon may also occur as a result of misalignment of the photosensitive film pattern 11 when forming the same to form the contact holes 12.

SUMMARY OF THE INVENTION

It is an advantage of the present invention to provide a method for manufacturing a MOS (metal-oxide-semiconductor) transistor of a semiconductor device that prevents the occurrence of the contact spiking phenomenon in which a field oxidation film is excessively etched during etching of an insulating layer in order to form contact holes.

It is another advantage of the present invention to provide a semiconductor device employing a MOS transistor manufactured using the method of the present invention.

In the present invention, part of an unreacted metal thin film that is unused when forming silicide is left remaining over a field oxidation film such that excessive etching of the same is prevented.

In one embodiment, the present invention includes a method for manufacturing a metal-oxide-semiconductor transistor. The method includes forming a metal thin film and an isolation oxidation film on a semiconductor substrate, and selectively etching the isolation oxidation film such that the isolation oxidation film is left remaining only over a field oxidation film; heat treating the semiconductor substrate to form silicide by the metal thin film in gate, source, and drain regions; removing portions of the metal thin film that is not formed into silicide, that is, removing unreacted metal thin film; removing the isolation oxidation film left remaining on the field oxidation film; and heat treating the semiconductor substrate in an oxygen environment to form the unreacted metal thin film remaining on the field oxidation film into a metal oxidation film.

Preferably, the isolation oxidation film is formed by performing deposition to a thickness of 300~500 Å using plasma enhanced chemical vapor deposition, and the metal oxidation film is formed by performing rapid thermal processing in an oxygen environment, at a temperature of 700~800° C., and for 20~40 seconds.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION

Embodiments of the present invention will now be described in detail with reference to the accompanying drawings.

FIGS. 2A to 2E are partial sectional views used to describe a method for manufacturing a MOS (metal-oxide-semiconductor) transistor according to an embodiment of the present invention.

Figure 1A:
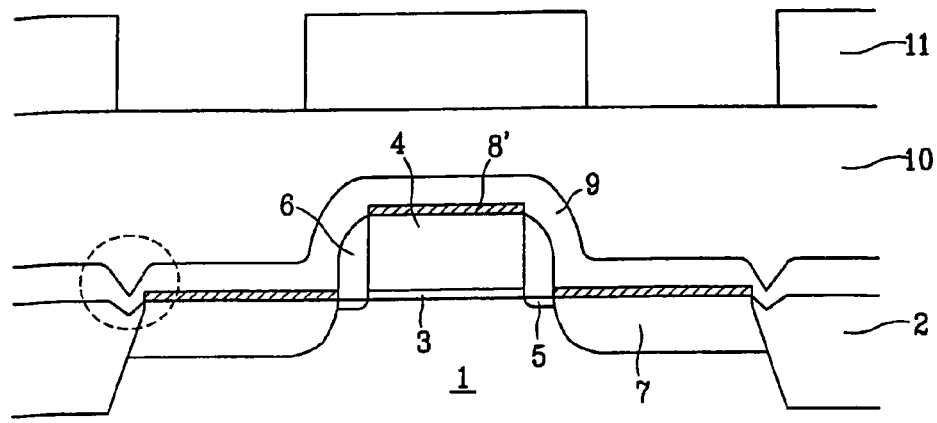
FIGS. 1A to 1B are partial sectional views used to describe a conventional method for manufacturing a MOS transistor.
Figure 1B:
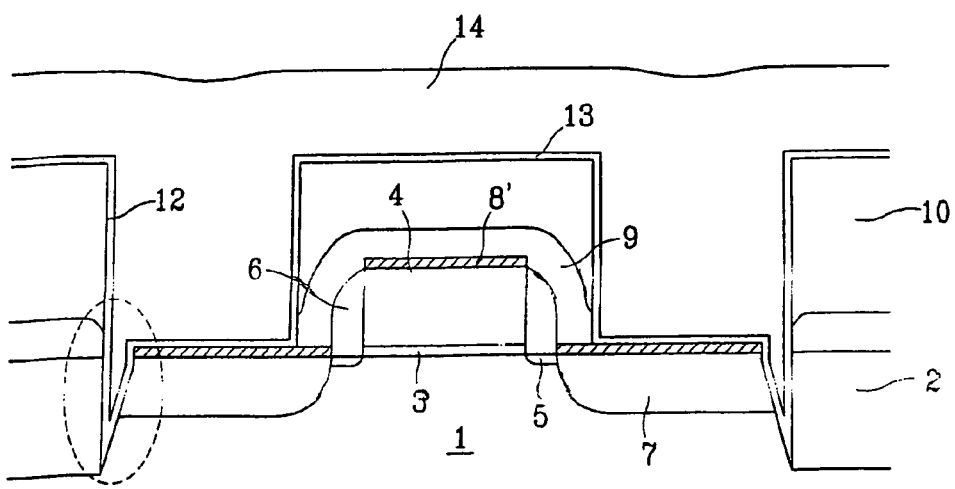
Figure 2A:
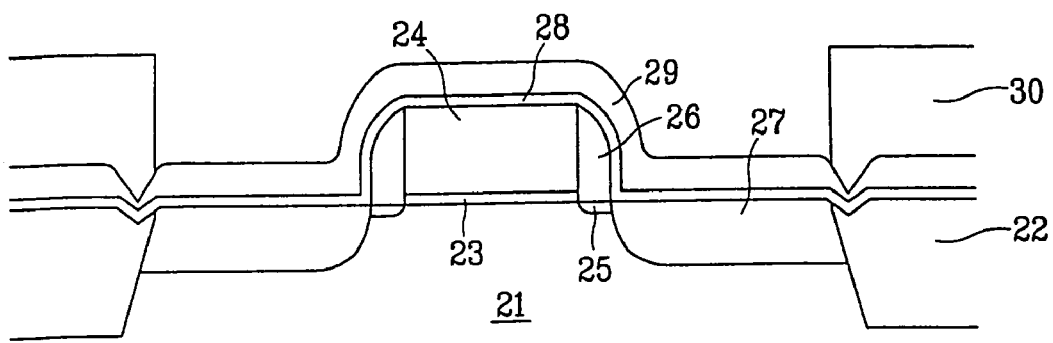
FIGS. 2A to 2E are partial sectional views used to describe a method for manufacturing a MOS transistor according to an embodiment of the present invention.

With reference first to FIG. 2A, a field oxidation film 22 is formed on a predetermined region of a silicon wafer 21 using a LOCOS (local oxidation of silicon) or a trench process. The predetermined region of the silicon wafer 21 where the field oxidation film 22 is formed is referred to as a device separation region, while all other areas are referred to as a device region. A gate oxidation film 23 is grown on a surface of the silicon wafer 21 in the device region by performing thermal oxidation of the silicon wafer 21.

Next, polysilicon is deposited over an entire surface of the silicon wafer 21 on a side of the same on which the gate oxidation film 23 is grown, thereby forming a gate electrode 24. Using the gate electrode 24 as a mask, a p-type or n-type dopant is ion-injected in the device region of the silicon wafer 21 such that LDDs (lightly doped drains), 25 are formed on the silicon wafer 21, and side walls 26 are formed to both sides of the gate oxidation film 23 and the gate electrode 24. Following this procedure, a conducting do pant identical to that used for the LDDs 25 is ion-injected at a high concentration on the device region of the silicon wafer 21 using the side walls 26 and the gate electrode 24 as a mask to thereby form a source 27 and a drain 27.

Subsequently, using a sputtering method, titanium 28 is deposited to a thickness of approximately 300~500 Å over the entire surface of the silicon wafer 1 on which the source 27 and drain 27 are formed, then an isolation oxidation film 29 is formed over the titanium 28 using PECVD (plasma enhanced chemical vapor deposition) to a thickness of roughly 800~1200 Å. Preferably, the titanium is deposited to a thickness of 400 Å and the isolation oxidation film 29 is deposited to a thickness of 1000 Å. Cobalt may be used in place of the titanium 28.

Figure 2B:
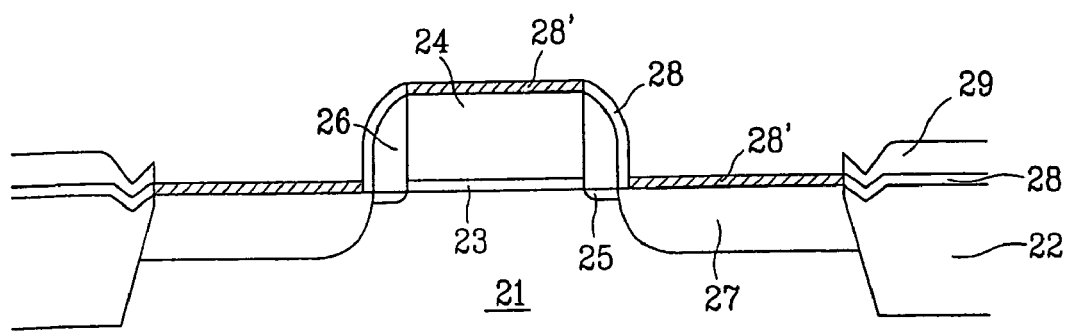

Following the above processes, a photosensitive film is deposited on the isolation oxidation film 29, then is film is exposed and developed to thereby form a counter active pattern 30 that exposes only the device region. The counter active pattern 30 is then used as a mask to perform wet etching of the isolation oxidation film 29 and remove the same. Therefore, the isolation oxidation film 29 is left remaining only over the field oxidation film 22 as shown in FIG. 2B.

Next, RTP (rapid thermal processing) is performed for about 20~40 seconds at a temperature of roughly 700~800° C. while injecting nitrogen at a flow rate of approximately 50 sccm. As a result, titanium silicide 28' is formed by the reaction between the titanium 28 and silicon. The preferable temperature and time of performing RTP for the formation of the titanium silicide 28' are 750° C. and 30 seconds, respectively. The titanium 28 covering the side walls 26 and the field oxidation film 22 is unable to be reacted with the silicon and so remains as unreacted titanium 28.

Figure 2C:
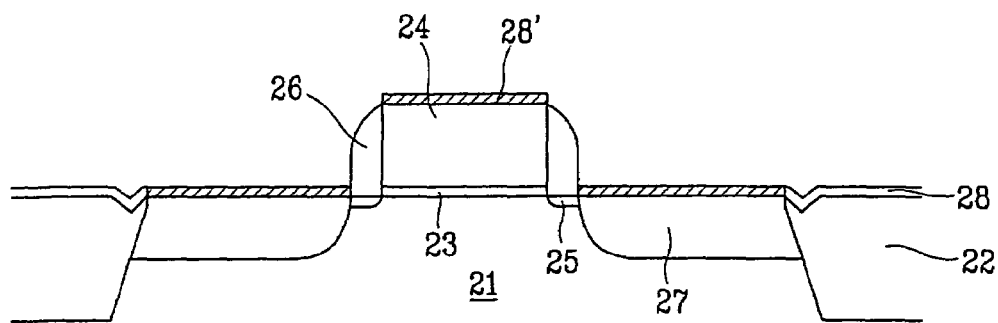

Following the above, the unreacted titanium 28 is removed. In this regard, since the unreacted titanium 28 that covers the field oxidation film 22 is itself covered by the isolation oxidation film 29, only the unreacted titanium 28 that covers the side walls 26 is extracted in this removal process as shown in FIG. 2C. The isolation oxidation layer 29 left remaining over the field oxidation film 22 is then removed using a solvent.

Figure 2D:
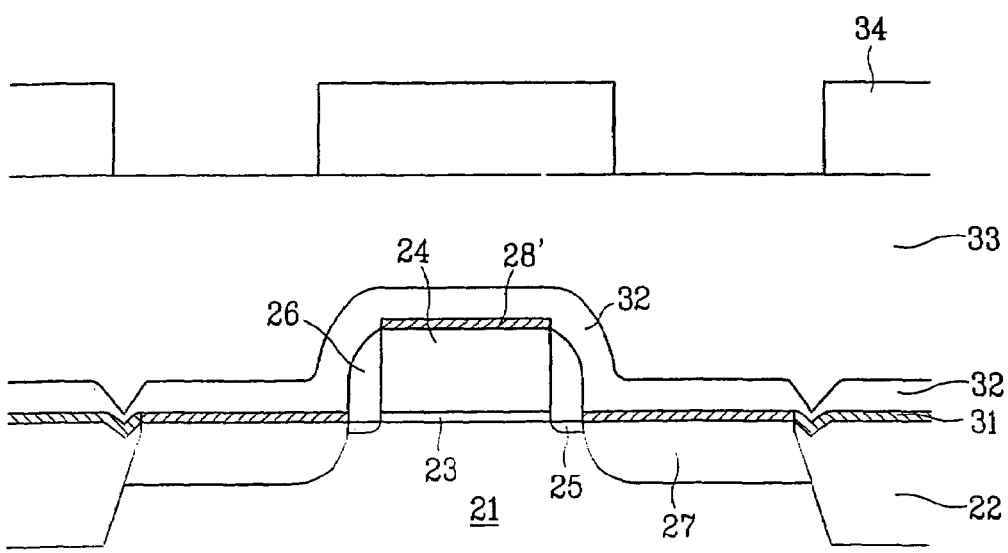
Figure 2E:
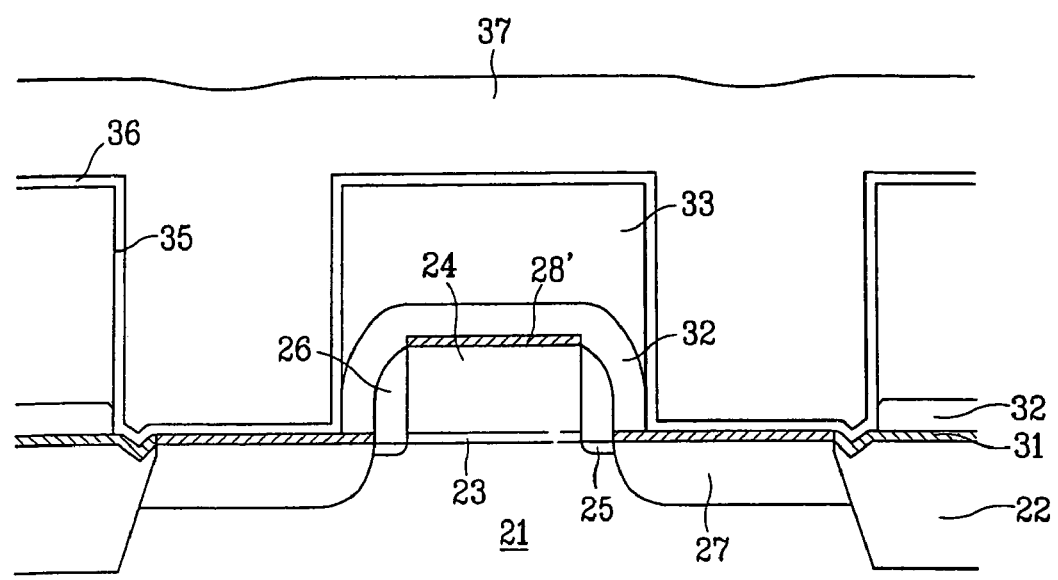

Subsequently, RTP is performed for about 20~40 seconds at a temperature of roughly 700~800° C. while injecting oxygen at a flow rate of approximately 50 sccm. Hence, the unreacted titanium 28 over the field oxidation film 22 is oxidized and formed into a titanium oxidation film 31 as shown in FIG. 2D. The preferable temperature and time of performing RTP for the formation of the titanium oxidation film 31 are 750° C. and 30 seconds, respectively. In this process, the titanium silicide 28' in the device region undergoes almost no reaction with the oxygen. Next, in order to reduce the resistance of the titanium silicide 28' and increase the strength of the same, a heat process is performed in a nitrogen environment, at a temperature of approximately 850~950° C., and for 5~15 seconds, preferably at a temperature of 910° C. and for 10 seconds.

Following the above, in order to form a film for use as an etching completion layer during etching to form contact, a silicon nitride film 32 is formed to a thickness of roughly 200~400 Å using PECVD. The silicon nitride film 32 is preferably formed to a thickness of 300 Å.

Next, an insulating layer, that is, a PMD (pre-metal dielectric) layer 33 is thickly formed on the silicon nitride film 32 using APCVD (atmospheric pressure chemical vapor deposition), after which the PMD layer 33 is heat treated at a temperature of 600~800° C. for 30~50 seconds such that the strength of the PMD layer 33 is increased. CMP (chemical mechanical polishing) is then performed to flatten the PMD layer 33. Heat treating of the PMD layer 33 is preferably performed at a temperature of 700° C. and for 40 seconds.

Subsequently, to prepare for the formation of contact holes, a photosensitive film pattern 34 is formed on the flattened PMD layer 33. Next, with reference to FIG. 2e, exposed areas of the PMD layer 33 are etched using the photosensitive film pattern 34 as a mask to thereby form contact holes 35. Since the titanium oxide film 31 is formed on the field oxide film 22, excessive etching of the field oxide film 22 where the field oxide film 22 is depressed adjacent to the device region is avoided.

TiN 36 is then thinly deposited-as a barrier metal film over the entire surface of the silicon wafer 21 on which the above elements are formed, after which tungsten 37 is used to cover all elements and fill the contact holes 35.

Further, a metal thin film (not shown) is deposited and patterned on the PMD layer 33 such that a metal wiring layer (also not shown) that connects to tungsten plugs filling the contact holes 35 is formed. This completes the semiconductor device.

In the method for manufacturing a MOS transistor according to the embodiment of the present invention described above, the isolation oxidation film is used so that unreacted titanium is left remaining on the field oxidation film, and the remaining unreacted titanium is oxidized to form the titanium oxidation film. As a result, the present invention prevents contact spiking in which there occurs excessive etching (into even the field oxidation layer adjacent to the device region) caused by the formation of depressions in the field oxidation film itself during the process of etching to form the contact holes or mis-alignment of the photosensitive film pattern. Therefore, current leakage and mis-operation of the device caused by contact spiking are prevented.

Although embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A semiconductor device, comprising:
   a semiconductor substrate having a device separation region formed by a field oxidation film;
   a metal-oxide-semiconductor transistor including a gate, a source, and a drain, the metal-oxide-semiconductor transistor being provided in a device region of the semiconductor substrate;
   an insulating film formed on the semiconductor substrate and including contact holes that expose portions of the gate, source, and drain;
   silicide formed on the metal-oxide-semiconductor transistor to reduce contact resistances of the gate, source, and drain;
   a liner film formed over the gate and filed oxidation film; and
   a metal oxidation film formed between the filed oxidation film and the liner film.

2. The semiconductor device of claim 1, wherein the silicide is formed of a metal such as titanium and cobalt.

3. The semiconductor device of claim 2, wherein the silicide is formed to a thickness of about 300 to 500 Å.

4. The semiconductor device of claim 1, wherein the metal oxidation film is formed of a metal such as titanium and cobalt.

5. The semiconductor device of claim 4, wherein the metal oxidation film is formed to a thickness of about 300 to 500 Å.

6. The semiconductor device of claim 1, wherein the liner film is a silicon nitride film, and the liner film is formed to a thickness of about 200 to 400 Å.

* * * * *